United States Patent
Kloen et al.

(10) Patent No.: US 7,176,582 B2
(45) Date of Patent: Feb. 13, 2007

(54) SEMICONDUCTOR DEVICE AND METHOD OF MANUFACTURING SAME

(75) Inventors: Hendrik Klaas Kloen, Nijmegen (NL); Gerardus Henricus Franciscus Willebrordus Steenbruggen, Nijmegen (NL); Peter Wilhelmus Maria Van De Water, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/510,591

(22) PCT Filed: Apr. 8, 2003

(86) PCT No.: PCT/IB03/01421

§ 371 (c)(1),
(2), (4) Date: Oct. 8, 2004

(87) PCT Pub. No.: WO03/085731

PCT Pub. Date: Oct. 16, 2003

(65) Prior Publication Data

US 2005/0167794 A1 Aug. 4, 2005

(30) Foreign Application Priority Data

Apr. 11, 2002 (EP) .................. 02076426

(51) Int. Cl.
*H01L 23/52* (2006.01)
*H01L 23/48* (2006.01)
*H01L 29/40* (2006.01)

(52) U.S. Cl. ............................. 257/781; 257/E23.054; 257/678; 257/787; 257/700; 438/124; 438/106

(58) Field of Classification Search ................ 257/678, 257/787, 781, 786, E23.054, E23.124, 700, 257/738, 737, 684; 438/124, 106
See application file for complete search history.

(56) References Cited

U.S. PATENT DOCUMENTS

| | | | | |
|---|---|---|---|---|
| 5,340,771 | A * | 8/1994 | Rostoker ..................... 29/827 |
| 5,656,550 | A * | 8/1997 | Tsuji et al. .................. 438/123 |
| 6,010,769 | A * | 1/2000 | Sasaoka et al. ............. 428/209 |
| 6,077,727 | A * | 6/2000 | Osawa et al. ............... 438/123 |
| 6,091,144 | A * | 7/2000 | Harada ........................ 257/724 |
| 6,238,952 | B1 * | 5/2001 | Lin ............................. 438/110 |
| 6,261,864 | B1 * | 7/2001 | Jung et al. .................. 438/106 |
| 6,333,252 | B1 * | 12/2001 | Jung et al. .................. 438/612 |
| 6,562,660 | B1 * | 5/2003 | Sakamoto et al. .......... 438/124 |
| 2001/0049156 | A1 | 12/2001 | Kyujin et al. |

FOREIGN PATENT DOCUMENTS

| EP | 1 143 509 | 10/2001 |
|---|---|---|
| EP | 1 160 858 A2 | 12/2001 |
| EP | 1 187 205 | 3/2002 |

* cited by examiner

*Primary Examiner*—Kenneth Parker
*Assistant Examiner*—Chris Chu
(74) *Attorney, Agent, or Firm*—Peter Zawilski

(57) ABSTRACT

In an example embodiment, the semiconductor device comprises a carrier and a semiconductor element, such as an integrated circuit. The carrier is provided with apertures, thereby defining connecting conductors having side faces. Notches are present in the side faces. The semiconductor element is enclosed in an encapsulation that extends into the notches in the carrier. As a result, the encapsulation is mechanically anchored in the carrier. The semiconductor device can be made in a process wherein, after the encapsulating step, no lithographic steps are necessary.

7 Claims, 4 Drawing Sheets

SEMICONDUCTOR DEVICE AND METHOD OF MANUFACTURING SAME

The invention relates to a semiconductor device comprising a carrier with a first and a second side situated opposite to each other, which carrier has a first electroconductive layer on the first side, which electroconductive layer is patterned in accordance with a desired pattern, thereby defining a number of mutually isolated connection conductors, on which first side of the carrier a semiconductor element is present, which semiconductor element is provided with connection regions that are electroconductively connected via connection means with the connection conductors of the carrier, which semiconductor element is encapsulated in a passivating envelope that extends as far as the carrier, on which second side, contact surfaces are defined in the connection conductors for placement on a substrate.

The invention also relates to a method of manufacturing a carrier having a first and a second side situated opposite to each other, which carrier comprises, on the first side, a first electroconductive layer that is patterned in accordance with a desired pattern, thereby defining a number of mutually isolated connection conductors, which carrier further comprises a second and a third layer.

The invention further relates to a method of manufacturing a number of semiconductor devices, which each comprise a semiconductor element with connection regions, which method comprises the following steps:

providing the semiconductor element on the first side of a carrier, an electroconductive connection being formed between the connection regions and the connection conductors of the carrier by means of the connection means;

providing a passivating envelope; and separating the semiconductor devices.

Such a semiconductor device, and such methods, are known from EP-A 1160858. The carrier of the known semiconductor device is produced by etching from the first side as far as halfway down said carrier. The resulting connection conductors extend such that a part thereof is covered by the semiconductor element and another part is not. The uncovered part is provided with an additional conductive film, enabling bonding wires to be attached. These bonding wires are the connection means between the semiconductor element and the connection conductors. For defining the contact surfaces a mask is provided, as shown in FIG. 4C of the prior-art document, after which the carrier is etched to a certain depth. The known carrier comprises three layers of the same material, for example copper, aluminum or a nickel-iron alloy, but may alternatively comprise aluminum, copper and aluminum as the layers.

A drawback of the known semiconductor device resides in that the adhesion of the envelope to the carrier is insufficient.

Therefore it is a first object of the invention to provide a semiconductor device of the type mentioned in the opening paragraph that has an improved adhesion between carrier and envelope.

The first object is achieved in that the envelope of the semiconductor device is mechanically anchored in the connection conductors, for which purpose the connection conductors are provided with side faces having recesses.

The mechanical anchoring obtained in the semiconductor device in accordance with the invention provides for good adhesion between the envelope and the carrier. In addition, this mechanical anchoring can be readily obtained, for example, because in addition to the first layer, the carrier comprises a second layer and a third layer, the second layer comprising a material that can be etched in an etchant that leaves the first and the third layer substantially in tact.

For the connection means use can be made of bonding wires; if bonding wires are used, the semiconductor element is attached to the carrier by means of an adhesive. Alternatively, use can be made of anisotropically conductive adhesive, bumps or solder. These connection means have the advantage, in comparison with bonding wires, that no or few assembly operations are necessary. In particular bumps are suitable because bumps made of, for example, gold or a gold alloy can be placed very accurately and do not cause contamination of the connection regions of the semiconductor element.

In a favorable embodiment the first and the third layer of the carrier contain Cu, while the second layer contains aluminum or a nickel-iron alloy. Alternatively, the first and the third layer may contain a nickel-iron alloy and the second layer may contain copper. It is considered less suitable if the first and the third layer are made of aluminum; aluminum has the disadvantage that wire bonding and plating on aluminum yield less favorable results. A three-layer carrier has the additional advantage over a two-layer carrier that warpage of the carrier as a result of a heating step is precluded.

In another embodiment, the carrier comprises electrically insulating layers, electroconductive connections being realized, by means of vias, from the first side to the second side of the carrier. Such an embodiment of a multilayer substrate is favorable, in particular, if passive components can be embedded in these layers. Examples of suitable electrically insulating layers are, inter alia, epoxy and silicon oxide.

The semiconductor element is preferably an integrated circuit but may alternatively be a discrete semiconductor. It is additionally possible that as well as the semiconductor element, one or more other elements are present on the substrate. These other elements may be active and passive elements.

It is a second object of the invention to provide methods of manufacturing a carrier and a number of semiconductor devices of the type mentioned in the opening paragraph, by means of which a semiconductor device with improved adhesion is obtained.

The second object is achieved in that the second layer is etched in an etchant that leaves the first layer and the third layer substantially in tact, said etching leading to underetching of the first layer, resulting in the formation of recesses in the connection conductors.

The third object is achieved in that the carrier that can be obtained using said method in accordance with the invention is used, and the passivating envelope is provided such that said envelope extends into the recesses defined in the carrier.

The semiconductor device in accordance with the invention is obtained in a simple manner using said method. A favorable aspect of the method in accordance with the invention is that it is not necessary to carry out a lithographic step after the semiconductor elements have been enveloped. This advantage can be realized in various ways.

In a first embodiment the pattern in the first layer is defined by means of punching, whereby apertures are formed that extend from the first side to the second side of the carrier. The connection conductors remain connected to a framework in the carrier by means of leads. By virtue of the definition of the apertures, patterning of the third layer of the carrier can be dispensed with. The second layer can be favorably etched in a wet-chemical process, wherein the carrier is immersed in a bath containing the etchant. When the carrier is subsequently used to manufacture the semiconductor device, said carrier is placed on a substrate when the encapsulation is provided. In the separating process, the leads between the connection conductors and the framework are cut through.

This embodiment has several important advantages for industrial-scale manufacture. First, this carrier can be processed in the same way as a standard carrier made of a single layer of copper. At the same time, the semiconductor device thus obtained is better because said device is thinner and does not have laterally projecting leads for attaching to a substrate. Second, the bath containing the etchant for the second layer, in this case, for example, aluminum or a nickel-iron alloy, can be added to one or more baths that are used already for the manufacture of the carrier. These baths are used to provide an NiPd(Au) layer on the first side of the carrier by means of plating. This has the advantage that the bonding wires can be excellently attached thereto. However, such an adhesive layer may also be provided in a different manner.

The carrier in accordance with this embodiment preferably has a thickness between 0.05 and 0.2 mm, and preferably comprises a first and a third layer of copper and a second layer of aluminum or a nickel-iron alloy; the layer thicknesses of the first, second and third layer are of the same order of magnitude.

The layers of the carrier, and particularly the second layer may contain any addition or impurities, such as in the case of AC, SI an d/or Cu.

To manufacture the semiconductor device with the carrier in accordance with this embodiment, conductive wires are used as connection means because it has been found the currently available techniques do not permit said carrier to be combined with bumps or anisotropically conductive adhesive. Besides, in the case of bumps or an anisotropically conductive adhesive, one or more surfaces are defined in the carrier, on which the semiconductor element can be attached by means of adhesive. This surface or these surfaces also serve as a heat sink.

In a second embodiment the carrier is provided on the second side with an etch mask that is resistant to a heat treatment. Prior to the provision of the semiconductor element and the encapsulation, the first layer and the second layer are patterned from the first side by means of etching. The third layer remains in tact, so that the carrier does not disintegrate. After the semiconductor element has been placed and encapsulated, the third layer or at least the surface thereof is patterned by means of the etch mask. In this manner, electroconductive contact surfaces are defined at the surface of the third layer.

These and other aspects of the semiconductor device and the methods of manufacturing the carrier and the semiconductor device in accordance with the invention will be explained in greater detail with reference to the drawings wherein.

Figure 1:
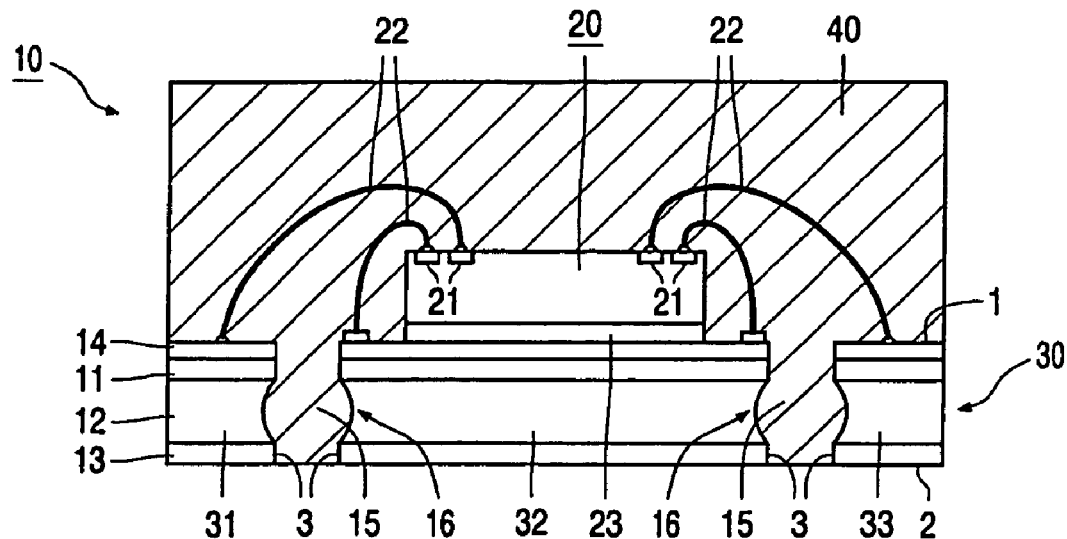
FIG. 1 is a diagrammatic cross-sectional view of a first embodiment of the semiconductor device.

The Figures are not drawn to scale. Like reference numerals refer to like parts. Alternative embodiments are possible within the scope of protection of the appended claims.

FIG. 1 is a diagrammatic cross-sectional view of a semiconductor device 10. Said semiconductor device 10 comprises a semiconductor element 20 that is present on a carrier 30. Said carrier 30 has a first side 1 and a second side 2 and comprises a number of connection conductors 31, 32, 33. Said connection conductors 31, 32, 33 having side faces 3 are mutually isolated by apertures 15. Between the connection conductors 31, 32, 33 and connection regions 21 in the semiconductor element 20 there are connection means, in this case bonding wires 22. In this example, the semiconductor element 20 is attached to the first side 1 of the carrier 30 by means of an adhesive layer 23. The semiconductor element 20 and the bonding wires 22 are encapsulated by an envelope 40. This envelope 40 extends into the apertures 15 of the carrier 30.

In accordance with the invention, recesses 16 are present in the side faces 3 of the connection conductors 31, 32, 33. These recesses 16 are filled with the envelope 40, as a result of which the first layer 31 is partly clamped by the envelope 40. This ensures that the envelope 40 is mechanically anchored in the carrier 30, leading to excellent adhesion and mechanical strength. In this case, adhesion-improving means do not have to be provided on the first side 1 of the carrier. The first side 1 can also be optimized for the placement of the semiconductor element 20 and the bonding wires 22.

In this embodiment, the carrier 30 is composed of a first layer 11, a second layer 12 and a third layer 13. The first layer 11 and the third layer 13 comprise mainly copper, and the second layer 12 comprises mainly aluminum. The recesses 16 in the second layer 12 are formed by means of etching, as will be explained with reference to FIGS. 5–9. The carrier 30 further comprises a top layer 14 on the first side 1 of NiPdAu or NiPd. This top layer 14 is desirable for a good adhesion with the bonding wires 22. As will be understood by persons skilled in the art, the top layer 14 may also comprise a different suitable material. The third layer 13 is patterned so as to form contact faces by the openings 15 which extend as far as the second side of the carrier 30. The connection conductor 32 is connected to ground and serves as a heat sink.

Figure 2:
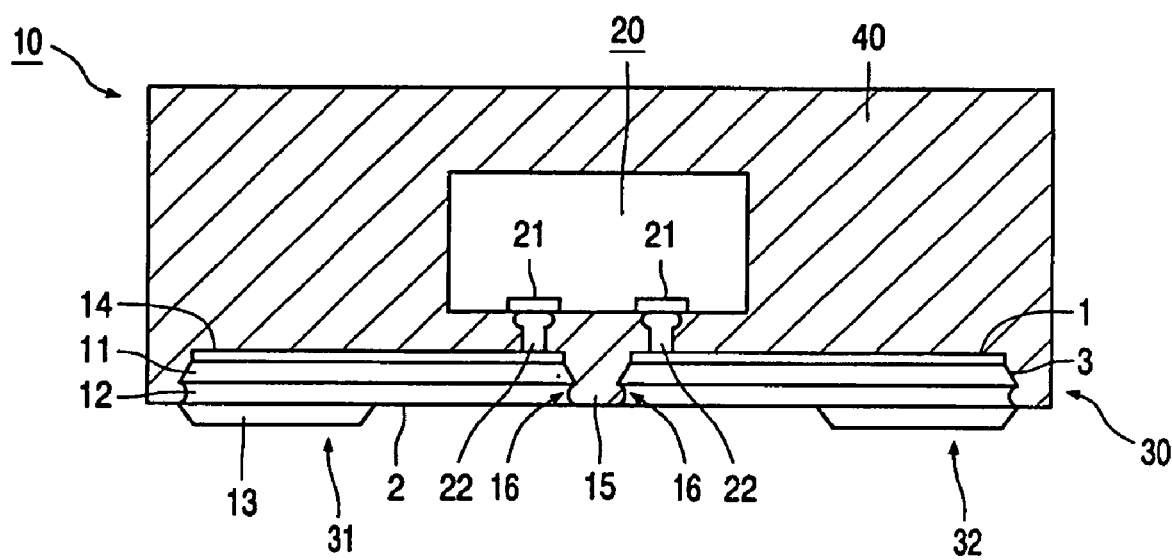
FIG. 2 is a diagrammatic cross-sectional view of a second embodiment of the semiconductor device.
Figure 3:
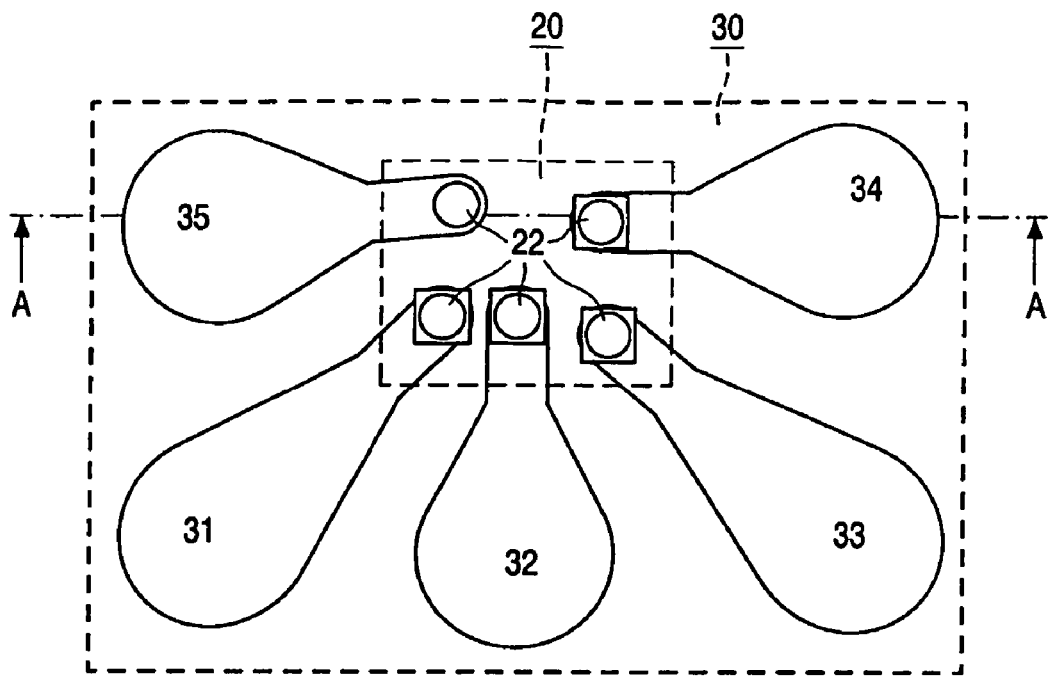
FIG. 3 is a diagrammatic plan view of the second embodiment.

FIG. 2 is a diagrammatic cross-sectional view of a second embodiment of the semiconductor device 10. FIG. 3 is a diagrammatic plan view of the second embodiment, wherein the line A—A indicates the cross-section of FIG. 2. The semiconductor device comprises a carrier 30 with a first layer 11, a second layer 12, a third layer 13 and a top layer 14. The carrier 30 is patterned from the first side, in which process apertures 15 and connection conductors 31–35 are formed. This is achieved by means of etching of, in succession, the first layer 11 and the second layer 12, thereby forming the recesses 16 in the side faces 3 of the connection conductors 31–35. Subsequently, the semiconductor element 20 with connection regions 21 is connected to the connection conductors 31–35 by connection means 22, in this case bumps of Au. For this purpose use is made of a flip-chip technique. To provide for good contact, the top layer 14 of Sn is provided on the first layer 11 of Cu. Subsequently the envelope 40 is provided. This results in mechanical anchoring since the envelope 40 extends into the recesses 16 of the carrier. Subsequently the third layer 13 is patterned by means of an etch mask that is already present, in particular an epoxy material as is also used in laminates. Next the etch mask is removed, as a result of which the apertures 15 extend from the first side 1 to the second side 2 of the carrier 30. The apertures 15 are subsequently also used to separate the semiconductor devices 10. This has the additional advantage that the mechanical anchoring substantially encapsulates the connection conductors 31–35. The size of the semiconductor device 10 is, for example, approximately 1×1 mm. The opening 16 has a width of, for example, 40–100 µm. The thickness of the first, second and third layer 11–13 is chosen to be 30 µm, 40 µm and 30 µm, respectively.

Figure 4:
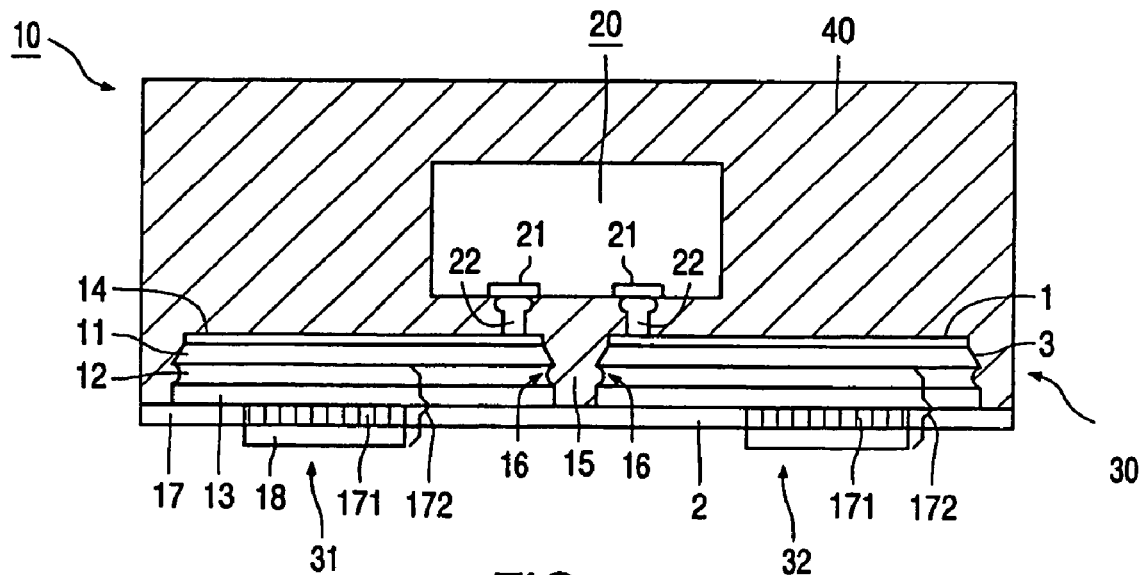
FIG. 4 is a diagrammatic cross-sectional view of a third embodiment of the semiconductor device.

FIG. 4 is a diagrammatic cross-sectional view of a third embodiment of the semiconductor device 10. The third embodiment largely corresponds to the second embodiment. The difference between the embodiments relates to the carrier 30 which, in the case of the third embodiment, comprises a passive component 172. For this purpose, the carrier 30 comprises, in addition to the first, the second and the third layer 11, 12, 13 which each contain electroconductive material, a fourth layer 17 of electrically insulating material and a fifth layer 18 of electroconductive material. The fourth layer comprises parts 171 in accordance with a desired pattern, which parts contain a dielectric material having a high dielectric constant, for example a material on the basis of barium titanate with a specific composition known to persons skilled in the art. This material is present, for example in powdered form, in the fourth layer 17 which additionally contains, for example, an epoxy material. In this case the passive components 172 are capacitors, but said components may alternatively be resistors or coils. In accordance with the diagrammatic Figure, the passive components 172 are arranged in series between the contact surfaces 18 and the semiconductor element 20. However, this is not necessary. Instead of the carrier 30 shown here, which is based on laminate or ceramic material, the carrier 30 may alternatively be a passive network for example on a silicon substrate.

Figure 5:
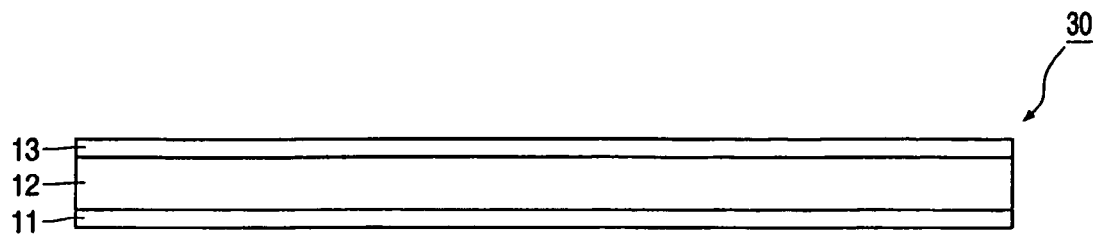
FIGS. 5–9 show steps in the methods of manufacturing the carrier and the semiconductor device.
Figure 6:
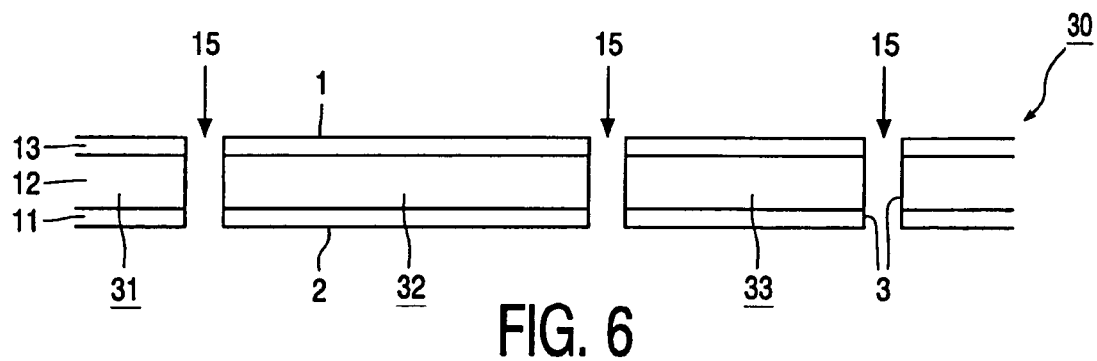
Figure 7:
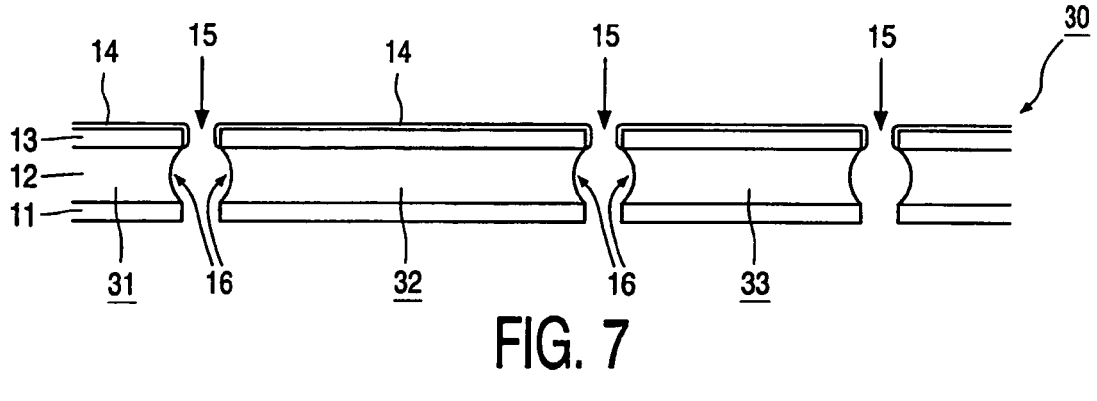
Figure 8:
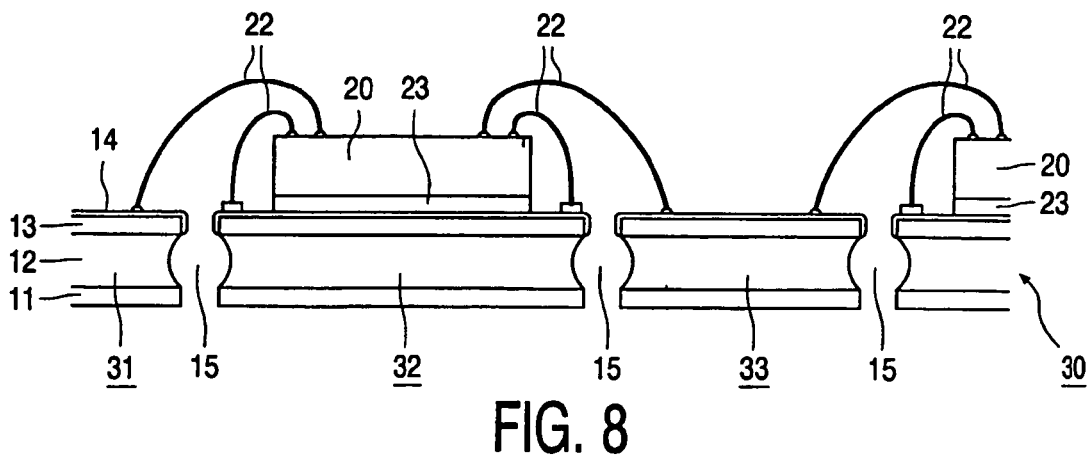
Figure 9:
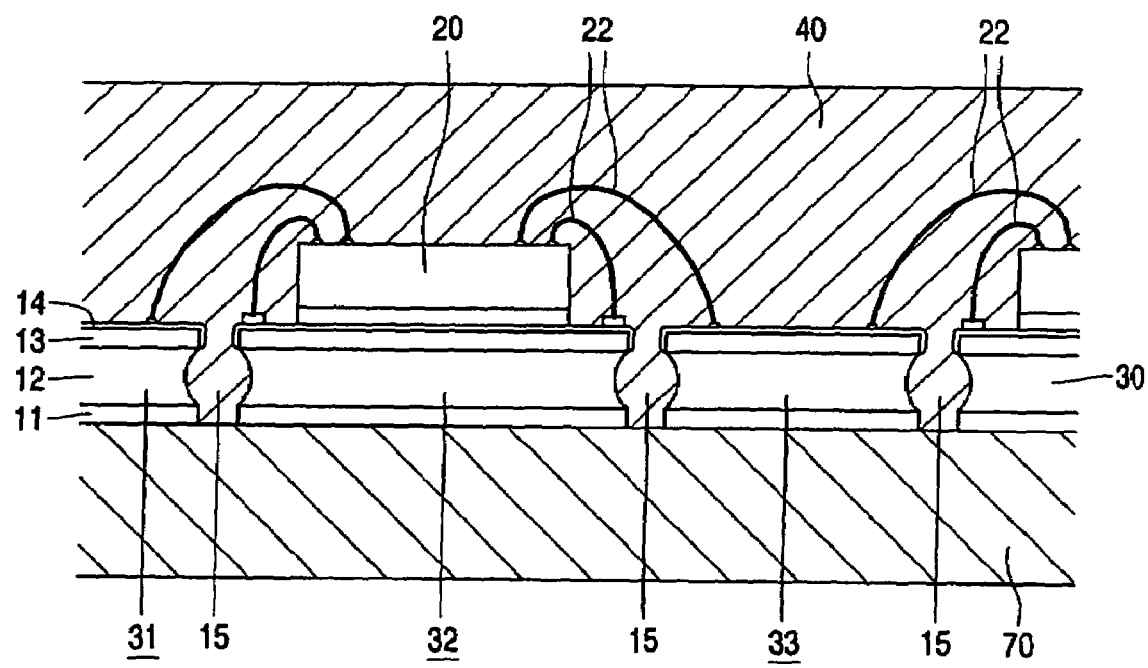

FIGS. 5–9 show various steps in the methods in accordance with the invention, which lead to the first embodiment of the semiconductor device 10, as shown in FIG. 1. FIGS. 5, 6 and 7 relate to the method of manufacturing the carrier 30. FIGS. 8 and 9 relate to the method of manufacturing semiconductor devices 10. The methods shown here have the advantage that they can be carried out without a lithographic step being required after the envelope has been provided, while at the same time the adhesion to the envelope 40 is excellent and the carrier 30 does not disintegrate prior to the enveloping step.

FIG. 5 shows the carrier 30 after a first step wherein a first layer 11 of Cu, a second layer 12 of Al and a third layer 13 of Cu are adhered to one another. It is possible to use the second layer 12 as the starting layer and provide a layer of Cu on either side thereof. Alternatively the carrier 30 can be formed by rolling together the layers 11, 12, 13, which technique is customarily used to form bilayers. Said process can also be carried out in two steps. It is also possible that eventually a four-layer or multilayer carrier is formed. The first, second and third layers 11, 12, 13 had a thickness of 70 µm in a first experiment. The thickness may vary however between 1 µm and 1.0 mm, preferably between 10 to 50 µm and the thicknesses of the first, second and third layers 11–13 do not have to be the same. If the first layer 11 is comparatively thin, the material that is preferably used for this layer has a large mechanical strength and rigidity, such as a nickel-iron alloy. In combination therewith, copper can be used for the second layer 12.

In order to improve the adhesion of the Cu and AL layers to each other, a heating step may be done after lamination of the layers. Such a heating step leads to diffusion of Cu atoms into the AL, therewith creating sublayers of an AL-Cu alloy.

FIG. 6 shows the carrier 30 after apertures 15 extending from the first side 1 to the second side 2 of the carrier 30 have been provided by means of punching. As a result of this punching operation, the connection conductors 31–33 having side faces 3 are defined. The connection conductors are connected in a customary manner to a framework in the carrier by means of leads that are not shown.

FIG. 7 shows the carrier 30 after it has been treated in a number of baths; the carrier 30 is first treated in a bath comprising a concentrated KOH solution for 3 minutes. In which process the second layer 12 of Al is etched, thereby forming recesses 16. The concentration of this etching solution is for instance 0.1 to 2 mole per liter. Preferably, a soluble ferricyanide is part of the etching solution as well, in a concentration in the range of sf/e up to saturation. It is even more preference that a soluble salt of a phosphorus aid deviced from trivalent or pentavelent phosphorus oxide is present as well. Such an addition can be used to set the desired amount of undercutting.

After said three minutes, the recesses had a width of 70 µm. However, a width of 10–20 µm is sufficient to obtain the desired mechanical anchoring. In addition, such a width has the advantage that the connection conductors can be miniaturized; for a connection conductor having a width of approximately 100 µm, wherein recesses 16 are provided at two side faces 3, the width of the recess can be approximately 30 µm at the most. Subsequently, the carrier 30 is treated in a bath in which a top layer 14 of NiPd is applied to the first side 1 of the carrier. The concentration of the etchant and the temperature of the etching bath can be adjusted. These are determined, in particular, by the velocity with which the carrier 30 moves through the bath used to apply the NiPd top layer 14.

FIG. 8 shows the carrier 30 after semiconductor elements 20 are adhered to the carrier by means of an adhesive 23 and bonding wires 22 are provided between the connection regions 21 of the semiconductor elements 20 and the connection conductors 31–33.

FIG. 9 shows the carrier 30, which is temporarily placed on a substrate 70, after the envelope 40 has been provided in a customary manner.

The invention claimed is:

1. A semiconductor device comprising a carrier with a first and a second side situated opposite to each other, which carrier has a first electroconductive layer of the first side, the first electroconductive layer is patterned in accordance with a desired pattern, thereby defining a number of mutually isolated connection conductors separated by apertures,
   on which first side of the carrier a semiconductor element is present, which semiconductor element is provided with connection regions that are electroconductively connected via connection means with the connection conductors of the carrier, which semiconductor element is encapsulated in a passivating envelope that extends as far as the second side of the carrier, but does not cover the second side of the carrier:
   on which second side, contact surfaces are defined in the connection conductors for placement on a substrate,
   characterized in that the envelope is mechanically anchored in the connection conductors, for which purpose the connection conductors are provided with side faces having recesses.

2. A semiconductor device as claimed in claim , characterized in that, in addition to the first layer, the carrier comprises a second layer and a third layer, the second layer comprising a material that can be etched in an etchant that leaves the first and the third layer substantially in tact.

3. A semiconductor device as claimed in claim 2, characterized in that the first and third layer contain copper, and the second layer contains a material selected from the group composed of Al and Ni—Fe.

4. A semiconductor device as claimed in claim 1, characterized in that the apertures extend as far as the second side of the carrier.

5. A semiconductor device as claimed in claim 1, characterized in that the connection means are bumps, which bumps are also used to attach the semiconductor element onto the carrier.

6. A semiconductor device as claimed in claim 1, characterized in that the carrier comprises a number of electrically insulating and conductive layers, at least one passive component being embedded in said layers.

7. The semiconductor device of claim 1, further comprising a substrate upon which the second side of the carrier is disposed.

* * * * *